(12) United States Patent
Bell

(10) Patent No.: US 6,373,143 B1
(45) Date of Patent: *Apr. 16, 2002

(54) INTEGRATED CIRCUIT HAVING WIREBOND PADS SUITABLE FOR PROBING

(75) Inventor: Paul Davis Bell, Colchester, VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/159,446

(22) Filed: Sep. 24, 1998

(51) Int. Cl.$^7$ .................. H01L 23/48; H01L 23/52; H01L 29/40; G01R 31/26
(52) U.S. Cl. .................. 257/786; 257/784; 257/48; 257/780; 257/775; 257/773; 257/692; 438/17; 438/18; 324/754; 324/755; 324/537; 324/795; 361/772; 361/760
(58) Field of Search .................. 257/780, 784, 257/786, 690, 692, 48, 773; 324/754, 537, 755, 765; 438/18, 17; 361/746, 772

(56) References Cited

U.S. PATENT DOCUMENTS

| | | | | |
|---|---|---|---|---|
| 3,717,800 A | * | 2/1973 | Thillays et al. | 257/773 |
| 4,223,337 A | * | 9/1980 | Kejima et al. | 257/784 |
| 4,241,360 A | * | 12/1980 | Hambor et al. | 363/59 |
| 4,403,240 A | * | 9/1983 | Seki et al. | 257/503 |
| 4,447,857 A | | 5/1984 | Marks et al. | 361/395 |
| 4,951,098 A | * | 8/1990 | Albergo et al. | |
| 4,959,706 A | * | 9/1990 | Cusack et al. | 257/786 |
| 4,990,996 A | | 2/1991 | Kumar et al. | 257/786 |
| 5,155,577 A | * | 10/1992 | Chance et al. | 257/786 |
| 5,342,992 A | * | 8/1994 | Frei et al. | 174/266 |
| 5,442,740 A | * | 8/1995 | Tane | 257/784 |
| 5,455,460 A | * | 10/1995 | Hongo et al. | 257/734 |
| 5,473,196 A | * | 12/1995 | Givry | 257/786 |
| 5,506,499 A | * | 4/1996 | Puar | 324/158.1 |
| 5,517,127 A | | 5/1996 | Bergeron et al. | 29/840 |

(List continued on next page.)

FOREIGN PATENT DOCUMENTS

| | | |
|---|---|---|
| JP | 56-124240 | 9/1981 |
| JP | 57-122542 | 7/1982 |
| JP | 58-15251 | 1/1983 |
| JP | 05-343487 | * 12/1993 |

OTHER PUBLICATIONS

Gow et al., "Semiconductor Chip I/O Configuration for Plastic Flat Pack, Tape Automated Bonding, or Solder Ball–Joined Flip Chip Packages", IBM Technical Disclosure Bulletin, vol. 33, No. 10B, pp. 332–333, Mar. 1991.

DeLuca et al., "Dynamic Burn–In of Integrated Circuit Chips at the Wafer Level", IBM Technical Disclosure Bulletin, vol. 29, No. 6, p. 2766, Nov. 1986.

Bona et al., "Optical Networks for VLSI–Interconnects on Flexible GaAs Substrate", IBM Technical Disclosure Bulletin, vol. 35, No. 2, pp. 26–27, Jul. 1992.

Primary Examiner—Alexander O. Williams
(74) Attorney, Agent, or Firm—Schmeiser, Olsen & Watts; Howard J. Walter, Jr.

(57) ABSTRACT

An integrated circuit device structure having probe pad extensions in electrical communication with the wire bond pads and a method for performing failure analysis thereon. The invention provides an improved probing system for wire bond packages such that neither the wire nor the wire bond from the pads on the chip surface need be removed during testing procedures. Included in the integrated circuit device is a plurality of conductive pads having a first area for receiving a wire bond and a second area for receiving a probe, wherein the second area abuts, and is an electrical communication with the first area.

11 Claims, 5 Drawing Sheets

U.S. PATENT DOCUMENTS

| | | | |
|---|---|---|---|
| 5,554,940 A | 9/1996 | Hubacher | 324/765 |
| 5,731,709 A | 3/1998 | Pastore et al. | 324/760 |
| 5,783,868 A * | 7/1998 | Galloway | 257/784 |
| 5,844,312 A * | 12/1998 | Bertlet et al. | 257/780 |
| 5,854,513 A * | 12/1998 | Kim | 257/786 |
| 5,856,687 A * | 1/1999 | Kimura | 257/786 |
| 5,886,414 A * | 3/1999 | Galloway | 257/784 |
| 5,914,614 A * | 6/1999 | Beamen et al. | 324/754 |
| 5,923,047 A | 7/1999 | Chia et al. | 257/784 |
| 5,994,152 A * | 11/1999 | Khandres et al. | 438/117 |
| 6,025,730 A * | 2/2000 | Akram et al. | 324/758 |
| 6,025,733 A | 2/2000 | Saitoh et al. | 324/763 |
| 6,091,155 A * | 7/2000 | Jonaidi | 257/786 |
| 6,107,111 A * | 8/2000 | Manning | 438/18 |

* cited by examiner

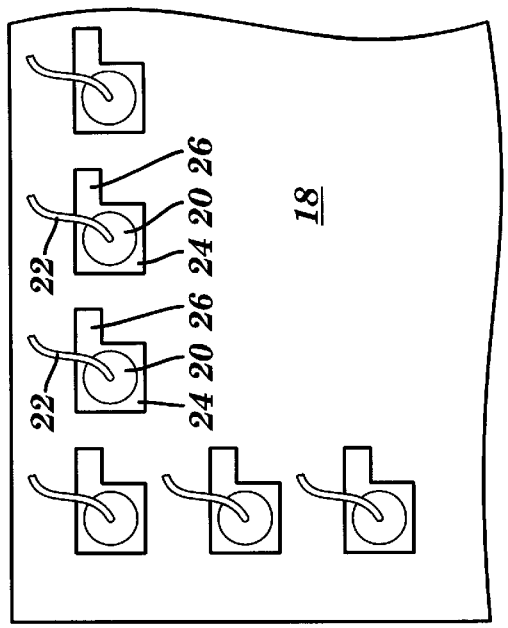
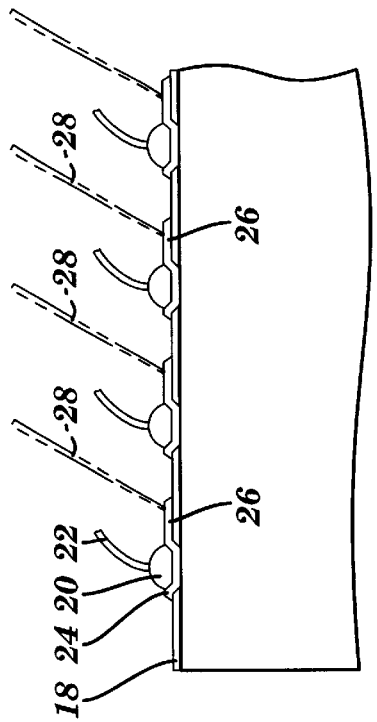
FIG. 3
FIG. 4
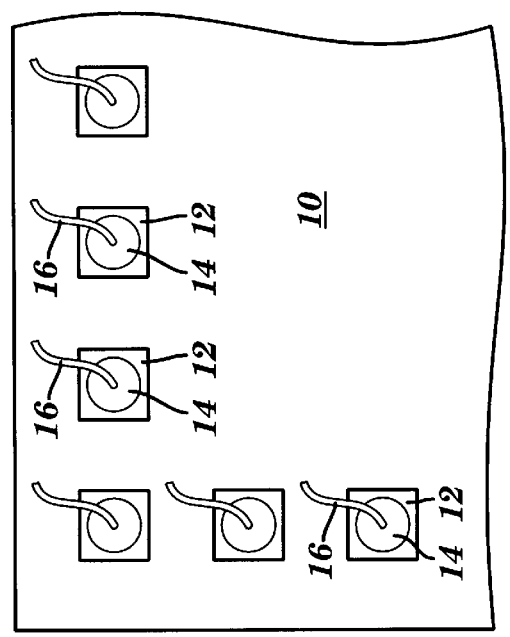
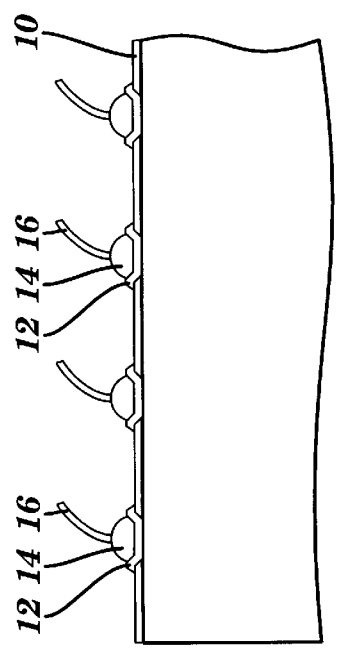
FIG. 1
RELATED ART
FIG. 2
RELATED ART

INTEGRATED CIRCUIT HAVING WIREBOND PADS SUITABLE FOR PROBING

TECHNICAL FIELD

The present invention generally relates to a structure and method for testing integrated circuit devices, and more particularly, to a structure and method for performing failure analysis on an integrated circuit.

BACKGROUND ART

The ability to perform failure analysis on integrated circuit (IC) devices is an important aspect of ensuring quality during the ongoing development life cycle of an IC. The process of analyzing faults may need to occur anywhere from early design stages of an IC right through to a point where an end user discovers a failure. Once the reason for the failure is detected, the IC design can be modified in order to correct the problem.

The process of performing fault analysis on an IC typically requires the removal of at least a portion of the packaging that makes up the IC device in order to expose the necessary electrical components. One of the most common IC packages includes the use of a chip carrier or lead frame to hold the much smaller chip or die, which contains the functional circuitry. Electrical connections between the chip and lead frame are typically accomplished with a wire bonding system where wires, typically formed of gold or aluminum, connect wire bond pads on the chip to metal pads on the lead frame. FIGS. 1 and 2 depict a chip 10 having pads 12 for receiving a wire 16. It can be seen that a first end of the wire 16 is formed into a ball or wire bond 14 that is bonded to pad 12. Once these connections have been made, the exposed area is encapsulated into a final product. In performing fault analysis on IC's using lead frame packaging, the encapsulated area must be removed in order to expose the chip pads 12.

Once the chip pads 12 are exposed, probes can be set in contact with the pads 12 in order to determine the cause of the failure. Unfortunately, an initial polishing step must be performed in order to remove most of the wire 16 and wire bond 14 from the pad 12. Without this removal step, it is very difficult to position the required number of probes in place. Furthermore, if the wire 16 and wire bond 14 are left in place, the probe would not directly contact the pad 12, and therefore potentially cause a faulty test result. Accordingly, under previous fault isolation techniques, it has been necessary to remove the ball bonds before attempting to probe for failures.

Unfortunately, in addition to adding an extra step, the removal of the wires and wire bonds from the chip limits the type and extent of testing that can be performed. For example, connections on and between chip pads cannot be verified. Thus, without an improved structure and method for performing fault analysis, the deficiencies of the prior art will remain.

SUMMARY OF THE INVENTION

The present invention overcomes the deficiencies of the prior art by including a structure and method for providing chips with probe pad extensions in electrical communication with the chip's pads. Accordingly, during a failure analysis process, probing can occur without removing the wire and/or wire bond from the pads on the chip surface. The invention therefore provides an integrated circuit comprising a plurality of conductive pads having a first area for receiving a wire bond and a second area for receiving a probe, wherein the second area abuts, and is in electrical communication with the first area.

In addition, a method for forming an integrated circuit device having wire bond pads that are easily probed is provided and comprises the steps of: (1) creating each wire bond pad within a single layer of the integrated circuit device during a fabrication process; and (2) forming each wire bond pad with a first area for receiving a wire bond and a second area for receiving a probe, wherein the first and second area are integrally formed substantially simultaneously, and wherein the first and second areas are in electrical communication with each other.

Finally, a method is provided for performing failure analysis on an integrated circuit after packaging is completed and a fault has been detected, wherein the integrated circuit comprises wire bond pads each having a pad extension formed adjacent to a portion of the pad having a wire bond, wherein the method comprises the steps of: (1) removing a portion of a lead frame packaging to expose the wire bond pads; and (2) probing the pad extension of at least one of the wire bond pads with the wire bond remaining affixed to the at least one wire bond pad.

It is therefore an advantage of the present invention to provide a system for more easily performing tests on an integrated circuit device.

It is therefore a further advantage of the present invention to provide a system for performing more robust tests on an integrated circuit device.

It is therefore a further advantage of the present invention to provide a system for performing failure analysis tests without removing wires and wire bonds from the pads of a chip.

BRIEF DESCRIPTION OF THE DRAWINGS

These and other features and advantages of this invention will be more readily understood from the following detailed description of the various aspects of the invention taken in conjunction with the accompanying drawings in which:

FIG. 1 depicts a top view of a chip with traditional wire bond pads;

FIG. 2 is a cross-sectional side view of FIG. 1;

FIG. 3 is a top view of an integrated circuit chip having wire bond pads in accordance with a preferred embodiment of the present invention;

FIG. 4 is a cross-sectional side view of FIG. 3;

DESCRIPTION OF THE PREFERRED EMBODIMENTS

Figure 6:
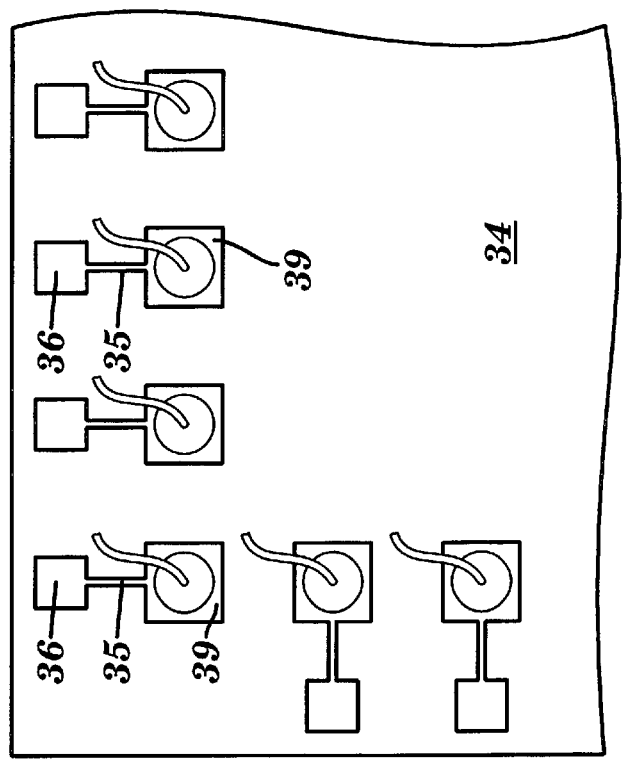
FIG. 6 is a second alternate embodiment of the present invention.

Referring now to the drawings, FIGS. 1 and 2 depict a chip 10 with pads 12 designed in accordance with known techniques. Attached to each pad 12 is a wire bond 14 and wire 16 that electrically connects pad 12 to a lead frame or chip carrier (not shown). In the past, in order to probe pads 12, the wire bond 14 and wire 16 were required to be removed with a polishing mechanism or other technique in order to provide enough surface area to allow a probe to contact pad 12. As noted above, this requirement represents a limitation. In particular, by disconnecting wires 16 from pads 12, the package is no longer in a usable state and package defects can no longer be isolated from IC defects. Thus, under existing techniques, it was impossible to exercise the IC to full application specifications for diagnostics and fault localization.

Referring now to FIGS. 3 and 4, a novel pad 24 is depicted that provides a pad extension 26 that allows the pad 24 to be probed without first removing the wire 22 and/or wire bond 20. As can be seen in FIG. 4, a probe tip 28 can be placed in contact with the pad extension 26 in order to effectuate a test without removing wire bond 20 or wire 22. In this embodiment, the pad extensions 26 extend between the pads and are about ¼ the size of the pad 24. Typical pads are 100 mm by 100 mm and include a pitch of about 200 mm. Therefore, the extensions are approximately 50 mm by 50 mm. It is conceivable that the pad extensions 26 could be 10 mm by 10 mm, or smaller, so long as the probe tips could be manufactured to contact the pad extensions. Thus, the actual size of the pad and pad extensions will generally be dictated by the need to maneuver between the wires extending from the balls as shown in FIG. 4.

Figure 5:
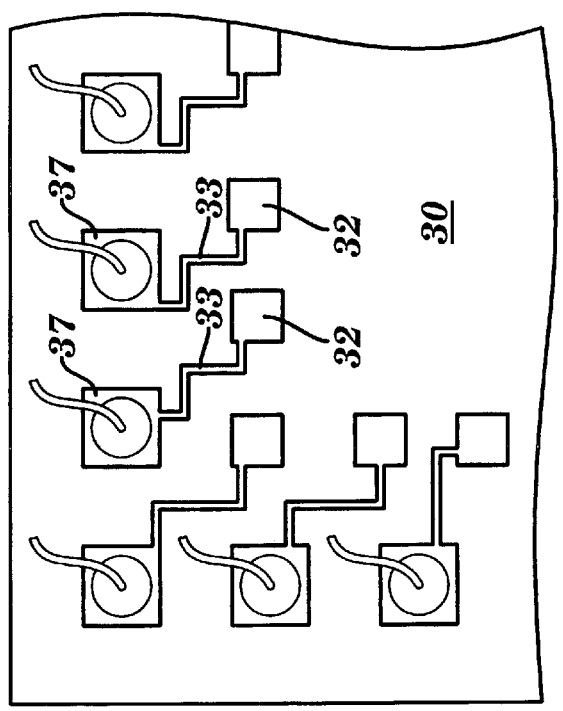
FIG. 5 is an alternate embodiment of the present invention.

Referring now to FIGS. 5 and 6, two alternate embodiments of the present invention are depicted on chip 30 and chip 34, respectively. FIG. 5 shows probe pads 32 arranged in a ring inside of the wire bond pads 37 and electrically connected by lands 33. FIG. 6 depicts probe pads 36 that are arranged in a ring outside of the wire bond pads 39 and connected by lands 35. Because the lands 33 and 35 need only be about 20 mm wide, these arrangements present no additional chip size requirement. The embodiments depicted in FIGS. 5 and 6, which neatly organize the probe pads on the chip, are particularly suited for chips that require a large number of probes.

Figure 7:
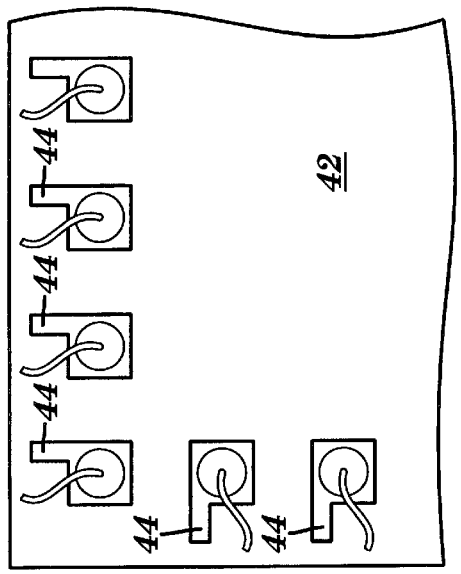
FIG. 7 is a third alternate embodiment of the present invention.
Figure 8:
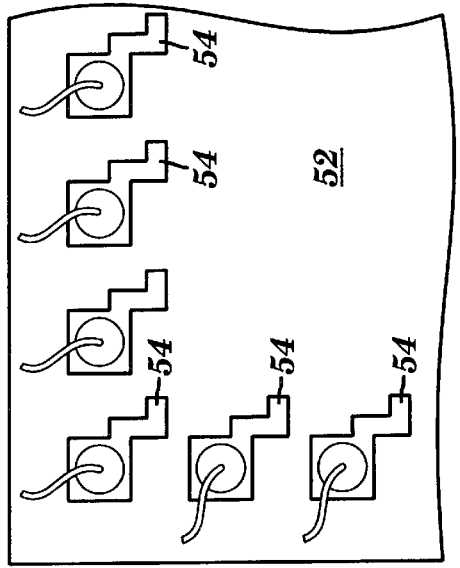
FIG. 8 is a fourth alternate embodiment of the present invention.
Figure 9:
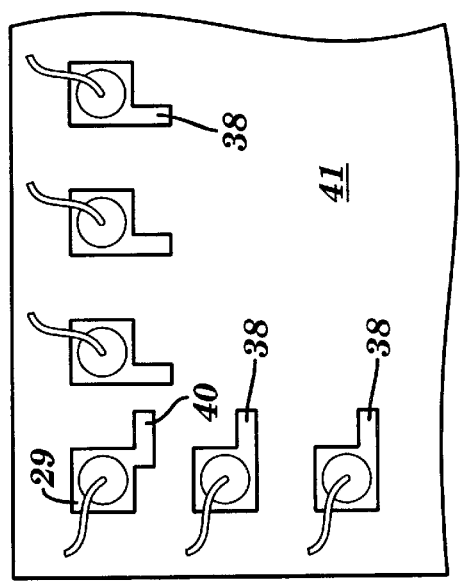
FIG. 9 is a fifth alternate embodiment of the present invention.
Figure 10:
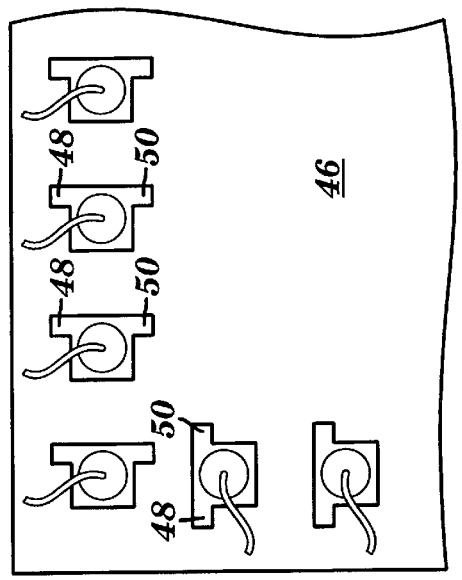
FIG. 10 is a sixth alternate embodiment of the present invention.
Figure 11:
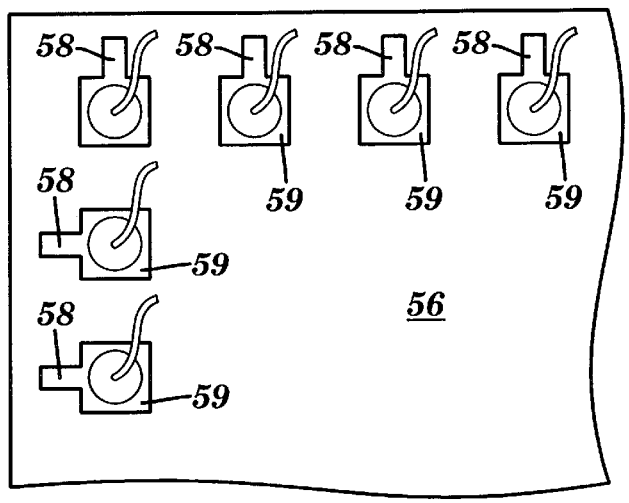
FIG. 11 is a seventh alternate embodiment of the present invention.

FIGS. 7–11 depict additional embodiments of the present invention. For example, FIG. 7 depicts a chip 41 that includes pad extensions 38 extending towards an interior portion of the chip and include corner pads 29 with pad extensions 40 that are also offset towards the center of the chip 41. FIG. 8 depicts a chip 42 with pad extensions 44 that extend towards an exterior portion of the chip 42. FIG. 9 depicts a chip 46 with pads that include two pad extensions 48 and 50 that extend both toward and away from the center of the chip 46. FIG. 10 depicts a chip 52 that includes pad extensions 54 that are bent to extend in two directions. FIG. 11 depicts a chip 56 having pad extensions 58 that extend from a center portion of a pad 59 toward an exterior portion of the chip 56. As is evident from these embodiments, any number of alternative designs are possible and are considered to be within the scope of this invention. The placement of the pad extensions may be in part influenced by the type of probing system used to perform failure analysis. For example, probing may be performed with a group of single probes on a probe station or with a probe ring on a tester, voltage contrast tool, or any other analytical equipment. Certain configurations may be particularly suited for use with a probe ring, while others may be better suited for single probe usage.

In the preferred embodiment of the present invention the entire wire bond pad is created within a single layer of the integrated circuit device during the fabrication process. In this manner, no additional cost or processes are added to the manufacturing of the chip in order to add this additional functionality. Thus, the wire bond pad will be formed with a first area for receiving the wire bond, and a second area for receiving the probe, wherein the first and second area will be integrally formed substantially simultaneously during the fabrication process. The implementation of the pad extension is therefore accomplished during the same fabrication step as the pad itself. Accordingly, the only alteration necessary during the fabrication process may be a modification to the mask used to define the pad configuration on the layer at which the pads reside. The remaining fabrication steps (e.g., applying photoresist, developing photoresist, and the etching process) need not be altered.

Figure 12:
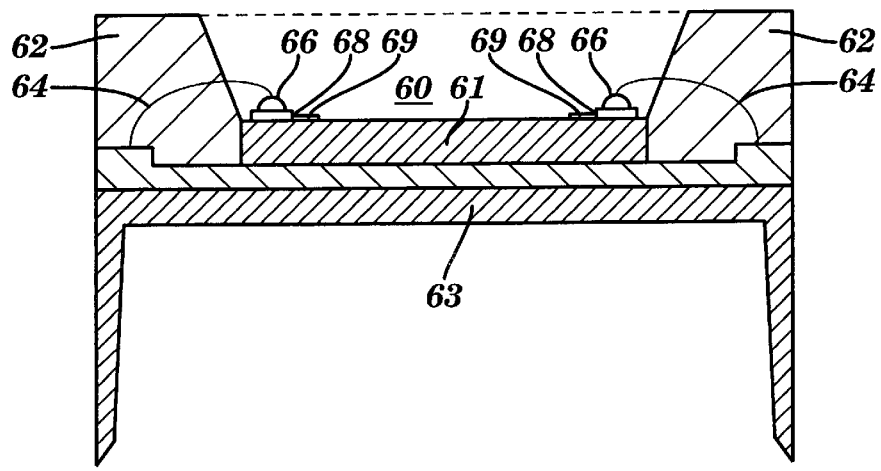
FIG. 12 is a cross-section side view of an integrated circuit device with a portion of the encapsulation removed in accordance with a preferred embodiment of the present invention.

In addition, a novel method for performing failure analysis on the integrated circuit after packaging is completed and a fault is detected, is described. Referring to FIG. 12, an integrated circuit device is depicted that includes a chip 61 and lead frame 63. Chip 61 includes pads 68 each having a wire bond 66 and wire 64 that electrically connects chip 61 to lead frame 63. In accordance with this invention, pad extensions 69 are also included to facilitate in the testing process. During the packaging process, chip 61 and the associated electrical connections are encapsulated in a insulative material 60 and 62 that entirely surrounds the chip 58. During the failure analysis procedure, a first portion 60 of the encapsulation material is removed. The removal of the encapsulation may be done with any known method, including the use of nitric acid. As can be seen, a second portion 62 of the encapsulation material is left intact. Once the first portion 60 of the encapsulation material is removed, probing of the system, using probe extensions 69 can occur without removing wire bond 66 or wire 64 from the pad 68. In addition to the example depicted in FIG. 12, it is understood that this technique could be used for the testing of any wire bonded system, including the case where a chip is wire bonded directly to a circuit board. In addition to the failure analysis application described herein, it is understood that the testing or probing procedures may be performed on the chip after the wire bond has been formed but prior to the encapsulation process. Thus, the probe extensions could be used as a mechanism for testing the chip prior to final packaging.

Figure 13:
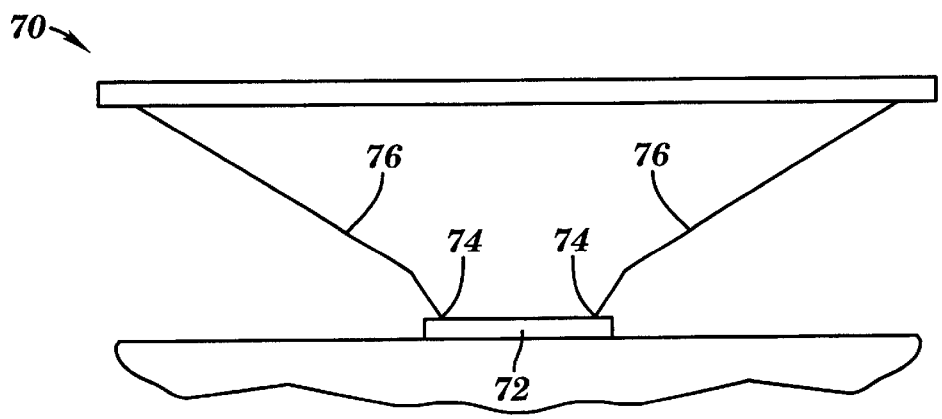
FIG. 13 is a side view of a probe ring in accordance with a preferred embodiment of the present invention.
Figure 14:
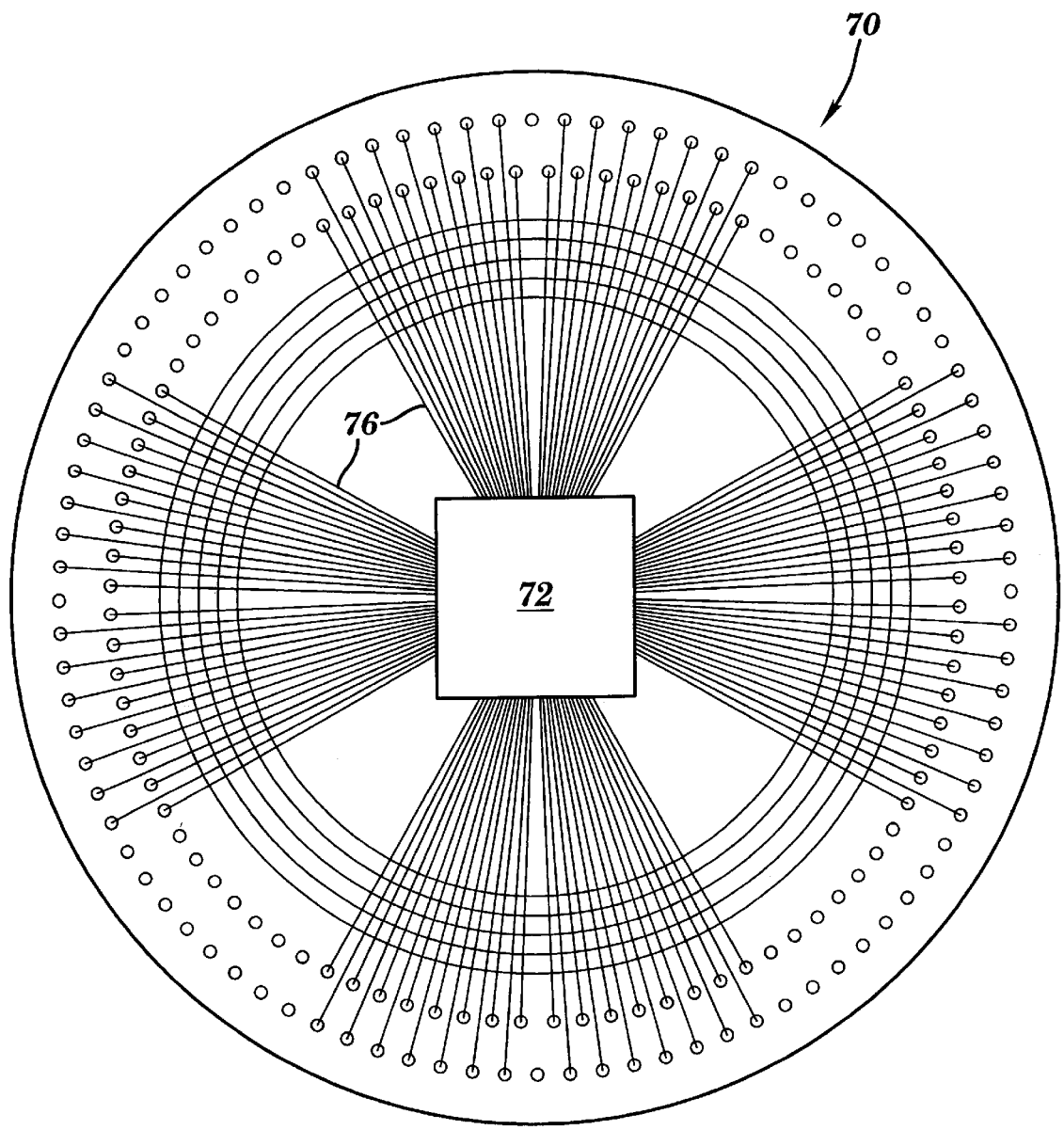
FIG. 14 is a top view of a probe ring in accordance with a preferred embodiment of the present invention.

Referring to FIGS. 13 and 14, a probe ring 70 is depicted. The probe ring includes a plurality of probes 76 that contact pad extensions 74 on the chip 72. In general, the probes are configured in a circular fashion around and above the chip 72. Generally, each pad on the chip 72 will have a probe in contact therewith for isolating faults.

While the invention has been described in detail herein in accordance with certain preferred embodiments thereof, many modifications and changes therein may be affected by those skilled in the art. Accordingly, it is intended by the appended claims to proper all such modifications and changes as fall within the true spirit and scope of the invention.

What is claimed is:

1. An integrated circuit, comprising:

a plurality of die pads having a first portion for receiving a wire bond and a second portion for receiving a probe, wherein the first and second portions are comprised of a single, unitary conductive structure;

said first portion characterized by a generally rectangular perimeter outline having a first surface area, said s second portion characterized by a generally rectangular perimeter outline having a second surface area, wherein said first surface area is larger than said second surface area;

wherein said first portion and said second portion form a single specified form structure within a single layer of the integrated circuit; and wherein a plurality of said form structures are patterned in a repetitive manner along the periphery of said integrated circuit.

2. The integrated circuit of claim 1, wherein the second portion extends towards a center of the integrated circuit.

3. The integrated circuit of claim 1, wherein the second portion extends towards an edge of the integrated circuit.

4. The integrated circuit of claim 2, further comprising a third portion that extends towards an edge of the integrated circuit.

5. The integrated circuit of claim 1, wherein the first and second portion are planar.

6. An integrated circuit comprising:

a plurality of test pads each comprising a single conductive pad having a first portion for receiving a wire bond and a second portion for receiving a probe, wherein the second portion abuts, and is in electrical communication with the first area;

wherein said first portion is characterized by a generally rectangular perimeter outline having a first surface area, said second portion characterized by a generally rectangular perimeter outline having a second surface area, wherein said first surface area is larger than said second surface area;

wherein said first portion and said second portion form a single specified form structure within a single layer of the integrated circuit; and wherein a plurality of said form structures is patterned in a repetitive manner along the periphery of said integrated circuit.

7. The integrated circuit of claim 6, wherein the first and second portions are comprised of a single, unitary conductive structure.

8. The integrated circuit of claim 6, wherein the second portion is smaller than the first portion.

9. An integrated circuit testing system, comprising:

an integrated circuit having a plurality of die pads having a first portion for receiving a bond and a second portion for receiving a probe, wherein the first and second portions are comprised of a single, unitary conductive structure within a single layer of the integrated circuit, and wherein each second portion of the plurality of die pads are patterned in a repetitive manner around the periphery of the integrated circuit;

wherein said first portion is characterized by a generally rectangular perimeter outline having a first surface area, said second portion characterized by a generally rectangular perimeter outline having a second surface area, wherein said first surface area is larger than said second surface area; and a probe ring having a plurality of probes for simultaneous testing of more than one die pad, wherein each probe of the probe ring is received on the second portion of a respective die pad.

10. The integrated circuit testing system of claim 9, wherein the second portion of each die pad resides closer to a center of the integrated circuit than the first portion.

11. The integrated circuit testing system of claim 9, wherein the second portion of each die pad resides closer to an edge of the integrated circuit than the first portion.

* * * * *